United States Patent
Izawa

(10) Patent No.: US 6,677,177 B1
(45) Date of Patent: Jan. 13, 2004

(54) SOLID STATE IMAGE SENSOR AND METHOD FOR MANUFACTURING THE SAME

(75) Inventor: Shin'ichiro Izawa, Gifu-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/721,866

(22) Filed: Nov. 24, 2000

(30) Foreign Application Priority Data

Nov. 25, 1999 (JP) .......................................... 11-333785

(51) Int. Cl.[7] .............................................. H01L 21/00
(52) U.S. Cl. ........................... 438/60; 438/144; 438/527
(58) Field of Search ........................... 250/208.1, 214.1; 257/290, 291, 431, 440; 348/294; 438/60, 144–148, 527, 529

(56) References Cited

U.S. PATENT DOCUMENTS

| | | | | |
|---|---|---|---|---|
| 5,057,926 A | * | 10/1991 | Wantanabe | 348/314 |
| 5,359,213 A | * | 10/1994 | Lee et al. | 257/223 |
| 5,502,318 A | * | 3/1996 | Hynecek | 257/217 |
| 5,563,404 A | * | 10/1996 | Anagnostopoulos | 250/208.1 |
| 5,567,641 A | * | 10/1996 | Hynecek | 437/53 |
| 5,627,388 A | * | 5/1997 | Shinji | 257/223 |
| 5,844,264 A | * | 12/1998 | Shinji | 257/223 |
| 5,861,645 A | * | 1/1999 | Kudo et al. | 257/291 |
| 6,040,859 A | * | 3/2000 | Takahashi | 348/243 |
| 6,180,935 B1 | * | 1/2001 | Hoagland | 250/208.1 |

OTHER PUBLICATIONS

Okada, et al. "Performance of FT–CCD Image Sensor with Single Layer Poly–Silicon Electrode", *CCD Development Department*, 219–222. Date?

* cited by examiner

Primary Examiner—Richard Booth
(74) Attorney, Agent, or Firm—Fish and Richardson, PC

(57) ABSTRACT

A solid state image sensor that prevents a reduction of transfer efficiency even if pixel size is reduced. A first semiconductor region is formed on a semiconductor substrate and a second semiconductor region is formed on the first semiconductor region. A plurality of parallel isolation regions are arranged in the second semiconductor region at predetermined intervals. Depth of the isolation regions is less than the thickness of the second semiconductor region such that the potential of transfer regions in the second semiconductor region is affected by a potential barrier formed in first semiconductor region rather than a potential barrier formed around the isolation regions when the intervals between the isolation regions are relatively narrow.

4 Claims, 5 Drawing Sheets

SOLID STATE IMAGE SENSOR AND METHOD FOR MANUFACTURING THE SAME

BACKGROUND OF THE INVENTION

The present invention relates to a solid state image sensor and a method for manufacturing the same, and, more particularly, to a charge-coupled device (CCD) solid state image sensor and a method for manufacturing the same.

FIG. 1 is a schematic diagram of a known solid state image sensor 100 of a frame transfer method.

The CCD solid state image sensor 100 includes an image sensing section 100i, a storage section 100s, a horizontal transfer section 100h and an output section 100d. The image sensing section 100i includes a plurality of parallel shift registers, which are arranged in the vertical direction. Each bit of each register forms a light receiving pixel. The storage section 100s includes a plurality of optically shielded shift registers that are arranged in series with the shift registers of the image sensing section 100i. Each bit of each optically shielded shift register forms a storage pixel. The horizontal transfer section 100h includes a single shift register arranged in the horizontal direction. The output of each shift register of the storage section 100s is supplied to each bit of the single shift register. The output section 100d includes a capacitor, which temporarily stores charges transferred from the horizontal transfer section 100h, and a reset transistor, which discharges the charges stored in the capacitor.

After information charges stored in each light receiving pixel of the image sensing section 100i have been transferred to the storage pixels of the storage section 100s, the information charges are transferred from the storage section 100s to the horizontal transfer section 100h, line by line. Then, the information charges are transferred from the horizontal transfer section 100h to the output section 100d, pixel by pixel. The output section 100d converts the information charges to a voltage signal, pixel by pixel, and supplies the voltage signal to an external circuit as a CCD output signal.

FIG. 2 is a schematic plan view of the image sensing section 100i. FIG. 3 is a schematic sectional view of the image sensing section 100i taken along line 3—3 of FIG. 2. FIG. 4 is a schematic sectional view of the image sensing section 100i taken along line 4—4 line of FIG. 2.

A P-type diffused layer 2, which is also called a device formation region, is arranged on the surface of an N-type silicon substrate 1. Parallel high-concentration P-type isolation regions (channel stops) 3 are arranged on the surface of the diffused layer 2 in the vertical direction of FIG. 2. N-type diffused layers 4 are arranged on the surface of the diffused layer 2 between the isolation regions 3. A channel region, which is the transfer route of information charges, is formed in each of the diffusion regions 4. A plurality of parallel transfer electrodes 6, which comprise a polycrystaline silicon, are arranged on the diffusion regions 4 at predetermined intervals via an insulating film 5, which comprises a silicon oxide film. For example, 3-phase transfer clocks φ1 to φ3 are applied to the transfer electrodes 6, and the potential of the channel region is controlled.

FIG. 5 is a diagram showing a profile of the potential in the depth direction of the silicon substrate 1 along line 5—5 of FIG. 3.

The potential level on the surface of the silicon substrate 1 is determined by the potential applied to the transfer electrodes 6, and the potential levels at deeper locations within depth of the silicon substrate 1 are determined by the potential applied to the silicon substrate 1. When charges are stored, the potential is gradually lowered from the gate insulating film 5 toward the middle of the N-type diffused layers 4 and shows a minimum value in the middle of the N-type diffused layers 4. The potential gradually increases from the middle of the N-type diffused layers 4 toward the middle of the P-type diffused layer 2 and shows a maximum value in the middle of the P-type diffused layer 2. Subsequently, the potential decreases toward the middle of the N-type silicon substrate 1. A potential barrier is formed according to the difference between the minimum value of the potential in the N-type diffused layers 4 and the maximum value of the potential in the P-type diffused layer 2, and the information charges generated in the silicon substrate 1 are stored in the potential barrier. If the information charges that exceed an allowable amount of storage are generated in the silicon substrate 1, excess charges cross the potential barrier and are drained to the middle of the silicon substrate 1.

The width of the isolation regions 3 need to be sufficient to provide electrical isolation, even if a mask deviation is generated when the diffusion regions 4 are formed. Hence, when a pixel size is reduced when the resolution of a solid state image sensor is increased, the region occupied by the isolation regions 3 increases and transfer efficiency falls. Further, when blooming suppression control is performed by the potential of the silicon substrate 1 and the transfer electrodes 6, the potential in the diffused layers 4 cannot be controlled with high accuracy because the diffused layers 4 are subject to the influence of the isolation regions 3. The influence of the isolation regions 3 remarkably affects in the reduction of the pixel size.

SUMMARY OF THE INVENTION

An object of the present invention is to provide a solid state image sensor that prevents a reduction of transfer efficiency even if pixel size is reduced.

In one aspect of the present invention a solid state image sensor is provided. The image sensor includes a semiconductor substrate. A first semiconductor region is formed in the semiconductor substrate. The first semiconductor region has a first conductivity. A second semiconductor region is formed in the first semiconductor region. The second semiconductor region has a second conductivity that is opposite to the first conductivity. A plurality of parallel isolation regions are arranged in the second semiconductor region at predetermined intervals. A plurality of transfer regions are defined in the second semiconductor region between the isolation regions. A plurality of parallel transfer electrodes are located over the second semiconductor region. The electrodes are transverse to the isolation regions. Depth of the isolation regions is less than the depth of the second semiconductor region such that the potential of the transfer regions is affected by a potential barrier formed in the first semiconductor region rather than a potential barrier formed around the isolation regions when the intervals between the isolation regions are relatively narrow.

In another aspect of the present invention, a method for manufacturing a solid state image sensor is provided. The method includes forming a first semiconductor region that has a first conductivity in a semiconductor substrate, forming a second semiconductor region that has a second conductivity, which is opposite to the first conductivity, in the first semiconductor region by diffusing first impurities that have the second conductivity in the first semiconductor region, forming a plurality of isolation regions that have the first conductivity in the second semiconductor region, wherein the isolation regions are separated by predetermined intervals by injecting parallel stripes of second impurities that have the first conductivity in the second semiconductor region, and forming a plurality of parallel transfer electrodes over the second semiconductor region, wherein the transfer electrodes are transverse to the isolation regions.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
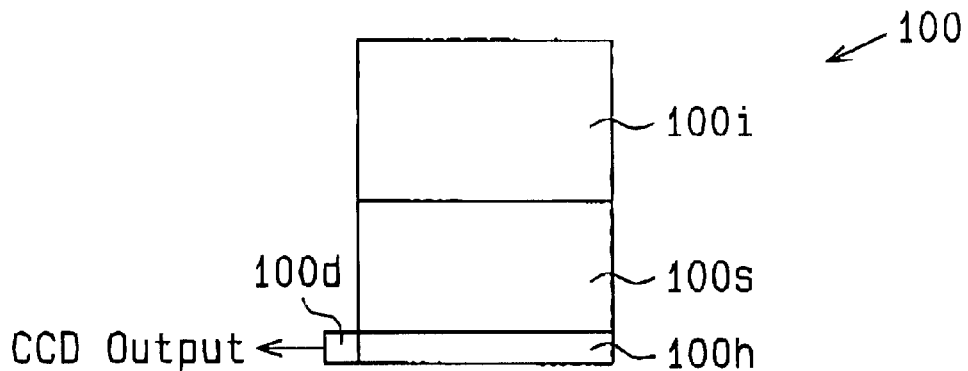
FIG. 1 is a schematic diagram of a solid state image sensor of a conventional frame transfer method.
Figure 2:
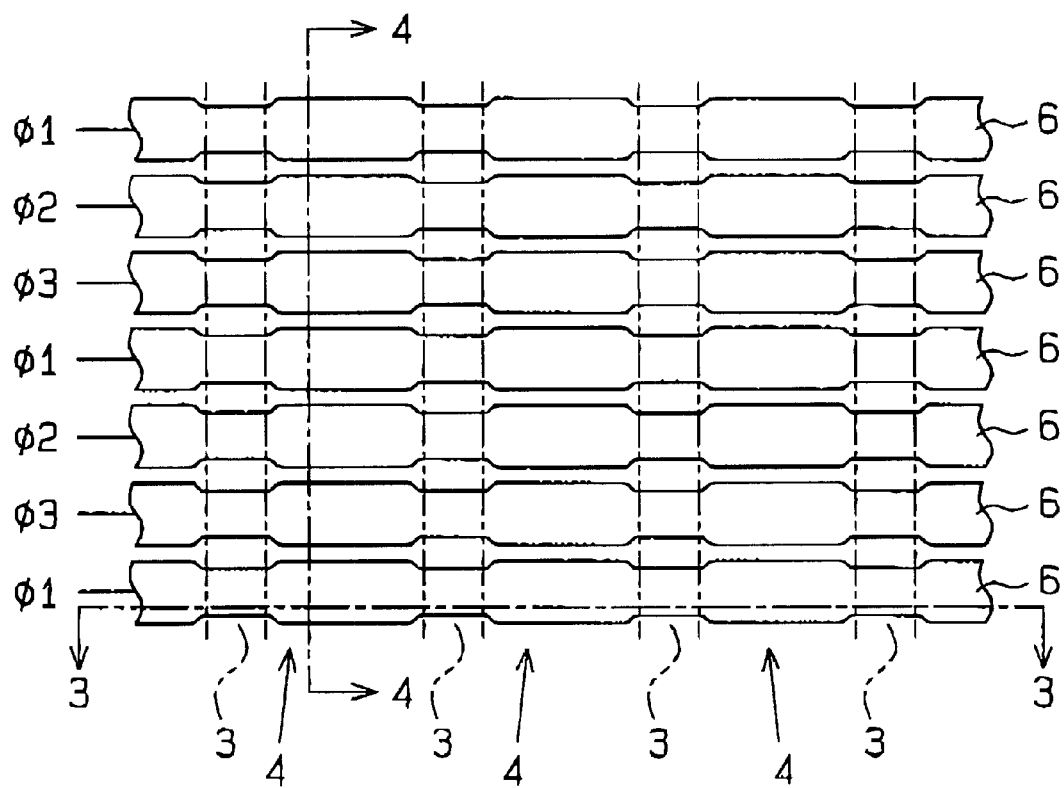
FIG. 2 is a schematic plan view of an image sensing section in the solid state image sensor of FIG. 1.

In the drawings, like numerals are used for like elements throughout.

Figure 3:
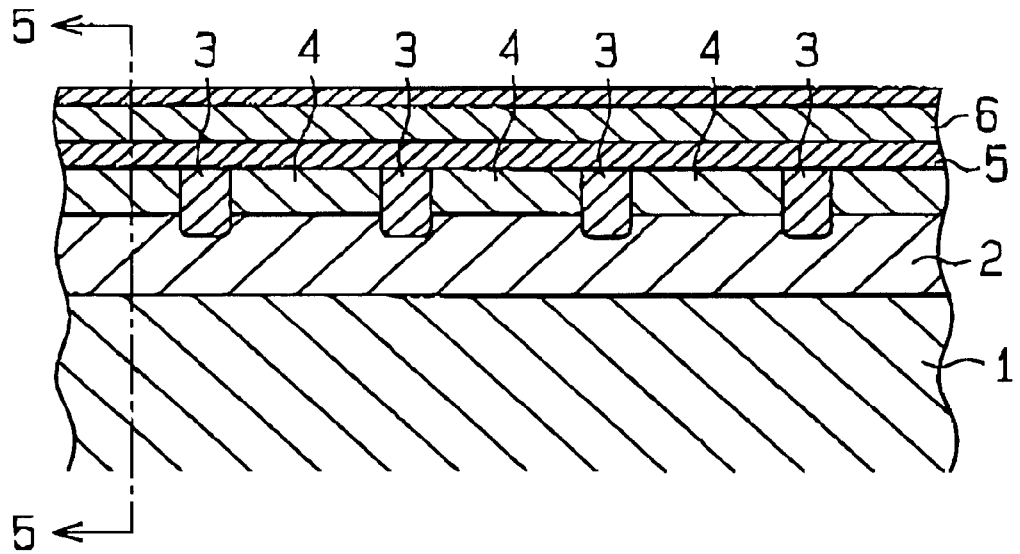
FIG. 3 is a schematic sectional view along line 3—3 of the image sensing section of FIG. 2.
Figure 6:
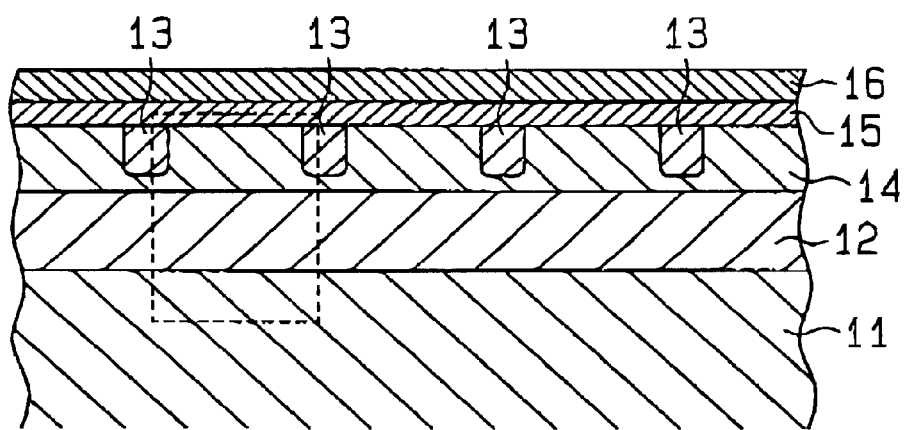
FIG. 6 is a schematic sectional view of an image sensing section of a solid state image sensor according to one embodiment of the present invention.

A solid state image sensor according to one embodiment of the present invention is described with reference to FIG. 6. A P-type diffused layer 12, or a device formation region, is arranged on the surface of an N-type silicon substrate 11. An N-type diffused layer 14, which is a charge transfer region, is arranged on the surface of the P-type diffused layer 12. A plurality of high-concentration P-type isolation regions 13 are defined in the N-type diffused layer 14. Adjacent P-type isolation regions 13 are arranged at predetermined intervals. The isolation regions 13 are arranged in the charge transfer direction in the same manner as the isolation regions 3 of FIG. 3. The thickness of the N-type diffused layer 14 is less than that of the P-type diffused layer 12. The height of the isolation regions 13 is less than the thickness or depth of the P-type diffused layer 14. That is, the isolation regions 13 are defined in the N-type diffused layer 14 for the P-type diffused layer 12 at a predetermined depth. In other words, there is a predetermined distance between the lower surfaces of the isolation regions 13 and the upper surface of the P-type diffused layer 12.

Figure 4:
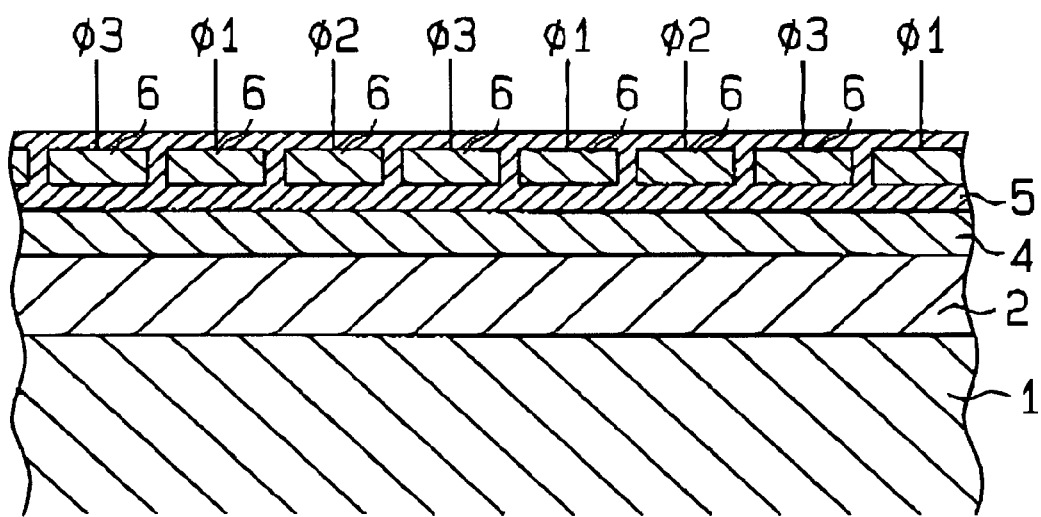
FIG. 4 is a schematic sectional view along line 4—4 of the image sensing section of FIG. 2.
Figure 5:
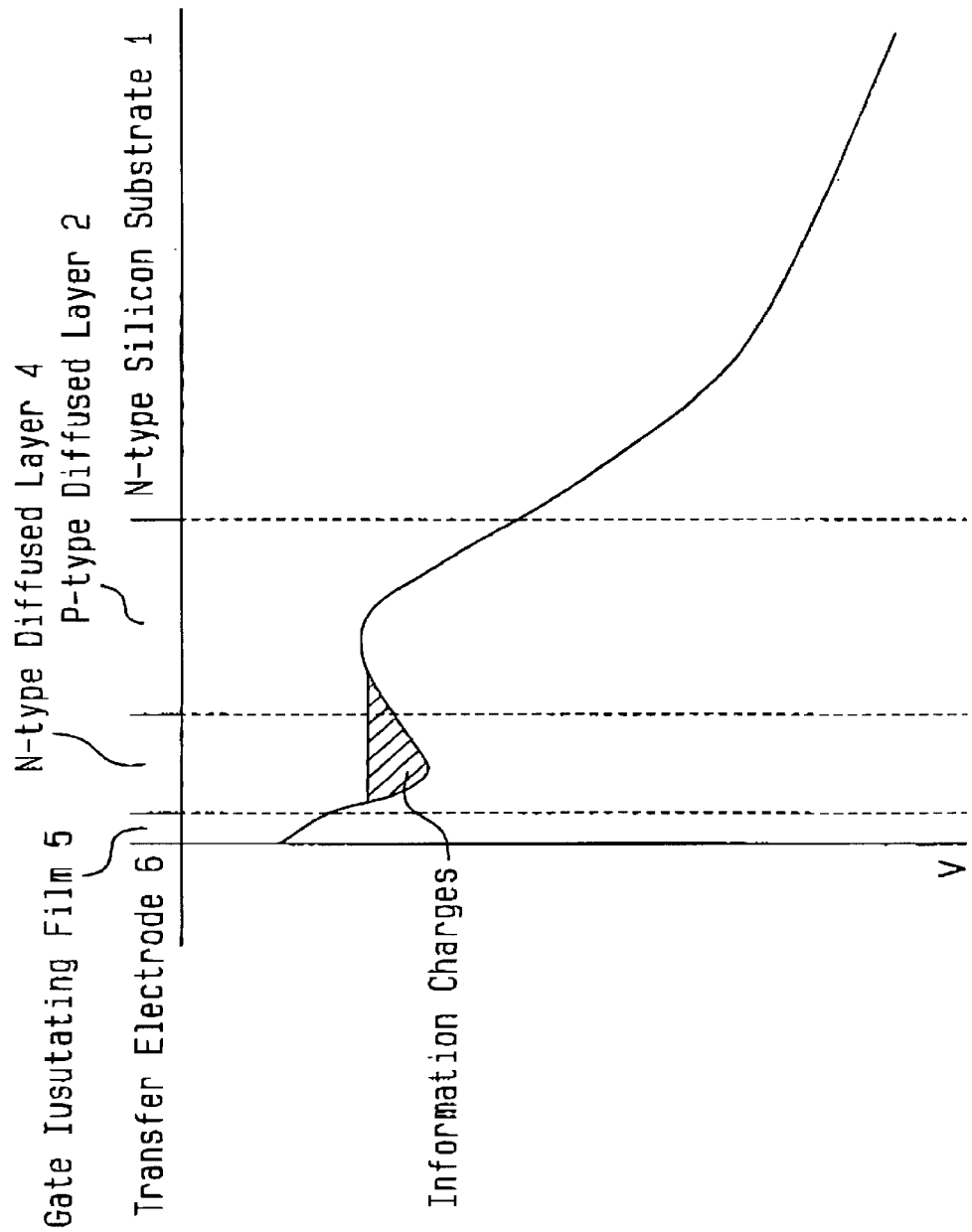
FIG. 5 is a diagram showing the potential of the solid state image sensor of FIG. 1.

An insulating film 15, which preferably comprises a silicon oxide film, is located over the silicon substrate 11, the P-type diffused layer 12, the N-type diffused layer 14 and the isolation regions 13. A plurality of parallel transfer electrodes 16 (one electrode is shown in FIG. 6), which preferably comprise polycrystaline silicon, are arranged on the insulating film 15 at predetermined intervals. The transfer electrodes 16 are transverse to the isolation regions 13 in the same manner as the transfer electrodes 6 of FIG. 4. The potential of a channel region is controlled by applying multi-phase transfer clock signals to the transfer electrodes 16.

A feature of the present invention is that the isolation regions 13, which have a smaller vertical dimension than the N-type diffused layer 14, are defined in the N-type diffused layer 14. This permits the width of the transfer regions to be reduced (the intervals between the isolation regions 13). In the prior art, when the intervals between the isolation regions 13 are equal to or smaller than 6 μm, the potential of the transfer region is affected by a potential barrier formed around the isolation regions 13 rather than a potential barrier formed in the P-type diffused layer 12. Accordingly, by making the depth of the isolation regions 13 less than the thickness of the N-type diffusion region 14, the potential of the transfer region is predominantly affected by the potential barrier formed on the P-type diffused layer 12. That is, the intervals between the isolation regions 13 are such that the potential of the transfer region is affected by the potential barrier formed on the P-type diffused layer 12 rather than the potential barrier formed around the isolation regions 13.

Figure 7A:
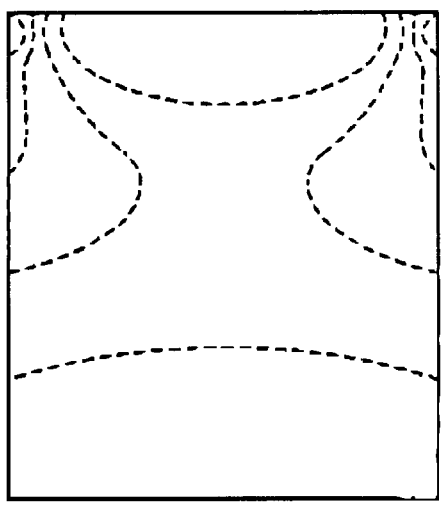
FIG. 7(a) is a diagram showing a simulation result of the potential in a charge transfer region of the image sensing section of FIG. 6.
Figure 7B:
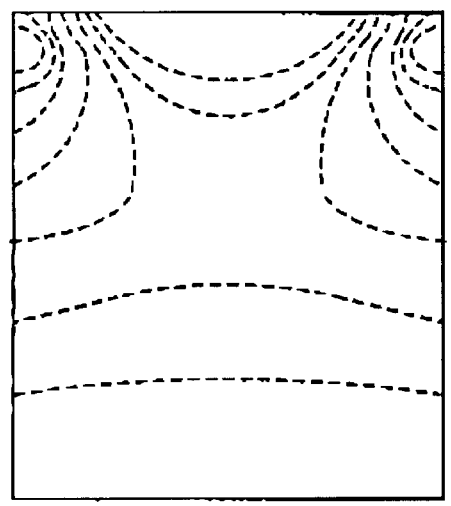
FIG. 7(b) is a diagram showing a simulation result of the potential in the same region as FIG. 7(a) in a conventional solid state image sensor.
Figure 8A:
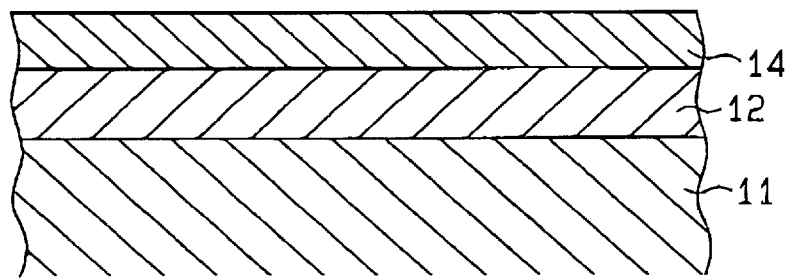
FIG. 8(a) to FIG. 8(c) are schematic sectional views for describing a manufacturing method of the solid state image sensor of the present invention.
Figure 8B:
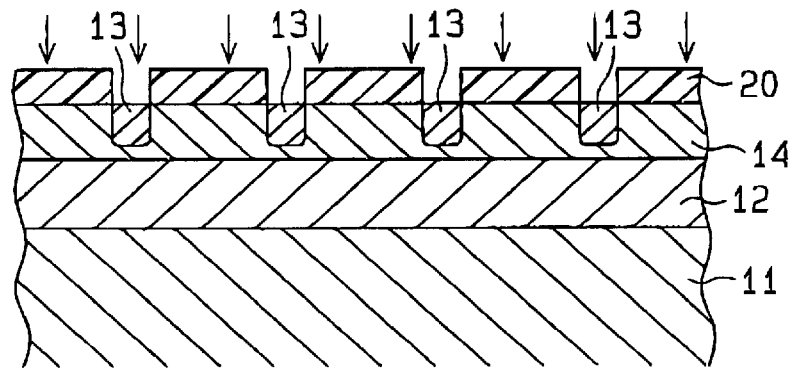
Figure 8C:
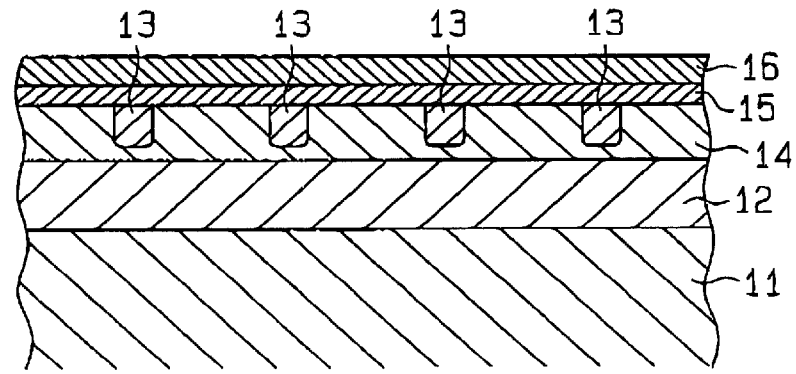

The potential state of the charge transfer region is evident from the simulation results shown in FIG. 7(a). FIG. 7(a) shows the potential in the region enclosed by the dotted lines of FIG. 6. FIG. 7(b) shows the potential in the same region as FIG. 7(a) in a conventional solid state image sensor in which the depth of the isolation regions is greater than the thickness of the N-type diffused layer The density of the equipotential lines in FIG. 7(a) is less than the density of the equipotential lines in the prior art example of FIG. 7(b). This indicates that the potential around the isolation regions 13 is unlikely to affect the charge transfer region. Accordingly, in the solid state image sensor of the present invention, the potential of the charge transfer region is designed in accordance with the impurity concentration distribution of the P-type diffused layer 12 and the N-type diffused layer 14 and the potential value is easily optimized.

Furthermore, even if the width of the charge transfer region is reduced due to a reduction of pixel size, the potential of the charge transfer region cen be controlled with high accuracy. As a result, a low potential is applied to the image sensing section 100i, the storage section 100s, the horizontal transfer section 100h and the output section 100d.

FIG. 8(a) to FIG. 9(c) are schematic sectional views for describing a method for manufacturing a solid state image sensor according to one embodiment of the present invention.

(a) First Process

The P-type diffused layer 12 is formed by diffusing P-type impurities on the surface of the N-type silicon substrate 11. The P-type diffused layer 12 is a device formation region. Then, the N-type diffused layer 14, which is thinner than the P-type diffused layer 12, is formed by diffusing N-type impurities in the P-type diffused layer 12.

(b) Second Process

A striped resist pattern 20 is formed on the N-type diffused layer 14. The resist pattern 20 has a plurality of openings extending in a predetermined direction at predetermined intervals. Then, the P-type isolation regions 13, which define the charge transfer regions, are formed by injecting high-concentration P-type impurities using the resist pattern 20 as a mask, In the impurity injection process, impurity injection energy is controlled so that the impurities are not injected beyond the N-type diffused layer 14.

(c) Third Process

The insulating film 15 is formed by forming a silicon oxide film on the isolation regions 13 and the N-type diffused layer 14. Then, the plurality of transfer electrodes 16 are formed by forming a polycrystaline silicon film on the insulating film 15 and patterning the polycrystaline silicon film.

In the manufacturing process, since the N-type diffused layer 14 is formed earlier than the isolation regions 13, displacement does not occur between the charge transfer region and the isolation regions 13. This is advantageous in scale down and improves the manufacturing yield.

It should be apparent to those skilled in the art that the present invention may be embodied in many other specific forms without departing from the spirit or scope of the invention. Particularly, it should be understood that the invention may be embodied in the following forms.

The present invention may apply to not only a solid state image sensor having the one-layer structured transfer electrodes 16 but also a solid state image sensor having two-layer structured transfer electrodes in which the adjacent transfer electrodes 16 are overlapped each other.

Therefore, the present examples and embodiments are to be considered as illustrative and not restrictive and the invention is not to be limited to the details given herein, but may be modified within the scope and equivalence of the appended claims.

What is claimed is:

1. A method for manufacturing a solid state image sensor comprising the steps of:

forming a first semiconductor region that has a first conductivity in a semiconductor substrate;

forming a second semiconductor region that has a second conductivity, which is opposite to the first conductivity, in the first semiconductor region by diffusing first impurities that have the second conductivity in the first semiconductor regions;

forming a plurality of isolation regions that have the first conductivity in the second semiconductor region, wherein the isolation regions are separated by predetermined intervals by injecting parallel stripes of second impurities that have the first conductivity in the second semiconductor region; and forming a plurality of parallel transfer electrodes over the semiconductor substrate including the isolation regions, wherein the transfer electrodes are transverse to the isolation regions.

2. The method according to claim 1, wherein, in the step of forming the isolation regions, the second impurities are injected such that the isolation regions have a depth that is less than the thickness of the second semiconductor region such that the potential of transfer regions, which are defined in the second semiconductor region between the isolation regions, is affected by a potential barrier formed in the first semiconductor region rather than a potential barrier formed around the isolation regions when the intervals between the isolation regions are relatively narrow.

3. The method according to claim 2, wherein the predetermined intervals between the isolation regions are equal to or smaller than 6 $\mu$m.

4. The method according to claim 1, wherein the first conductivity is a P-type conductivity and the second conductivity is an N-type conductivity.

* * * * *